United States Patent
Sakata et al.

(10) Patent No.: US 8,348,248 B2
(45) Date of Patent: Jan. 8, 2013

(54) BUBBLING SUPPLY SYSTEM FOR STABLE PRECURSOR SUPPLY

(75) Inventors: Yoichi Sakata, Tokyo (JP); Kazutaka Yanagita, Tsukuba (JP); Toshiyuki Nakagawa, Kobe (JP); Naoyuki Nakamoto, Himeji (JP)

(73) Assignee: L'Air Liquide Societe Anonyme pour l'Etude et l'Exploitation des Procedes Georges Claude, Paris (FR)

( * ) Notice: Subject to any disclaimer, the term of this patent is extended or adjusted under 35 U.S.C. 154(b) by 363 days.

(21) Appl. No.: 12/721,441

(22) Filed: Mar. 10, 2010

(65) Prior Publication Data
US 2010/0230834 A1    Sep. 16, 2010

Related U.S. Application Data

(60) Provisional application No. 61/159,334, filed on Mar. 11, 2009.

(51) Int. Cl.
*B01F 3/04* (2006.01)
(52) U.S. Cl. .......... 261/152; 261/123; 261/124
(58) Field of Classification Search .......... 261/121.1, 261/123, 124, 152, DIG. 65
See application file for complete search history.

(56) References Cited

U.S. PATENT DOCUMENTS

| | | | |
|---|---|---|---|
| 229,374 A * | 6/1880 | Bruns | 62/308 |
| 664,457 A * | 12/1900 | Bennett | 261/122.1 |
| 673,798 A * | 5/1901 | Kempshall | 261/64.1 |
| 797,615 A * | 8/1905 | Schmitt | 261/78.1 |
| 826,936 A * | 7/1906 | Hinds | 261/63 |
| 2,604,773 A * | 7/1952 | Wyssling | 68/183 |
| 5,552,181 A | 9/1996 | Kondoh et al. | |
| 5,595,691 A * | 1/1997 | Hsu | 261/120 |
| 5,755,885 A | 5/1998 | Mikoshiba et al. | |
| 6,142,458 A * | 11/2000 | Howk | 261/93 |
| 6,424,800 B1 | 7/2002 | Kim | |
| 6,444,038 B1 | 9/2002 | Rangarajan et al. | |
| 6,540,211 B2 * | 4/2003 | Tseng | 261/65 |
| 6,607,785 B2 | 8/2003 | Timmons et al. | |
| 6,698,728 B1 | 3/2004 | Ravetz et al. | |
| 6,905,610 B2 * | 6/2005 | Turchet et al. | 210/760 |
| 2008/0143002 A1 * | 6/2008 | Steidl et al. | 261/122.1 |
| 2008/0203006 A1 * | 8/2008 | James | 210/247 |
| 2008/0251016 A1 * | 10/2008 | Cunning et al. | 118/722 |

FOREIGN PATENT DOCUMENTS
EP    1 329 540    7/2003
(Continued)

OTHER PUBLICATIONS

International Search Report and Written Opinion for co-pending PCT/IB2010/051066 mailed Jun. 24, 2010.

*Primary Examiner* — Charles Bushey
(74) *Attorney, Agent, or Firm* — Patricia E. McQueeny

(57) ABSTRACT

Embodiments of the invention generally provide apparatus and methods for vaporizing liquid precursors. In one embodiment, a bubbling system for supplying a vapor of liquid precursor is provided including a gas flow conduit having a first end and a second end, a nozzle structure connected to the second end of the gas flow conduit, and comprising one or more perforated conduits fluidly coupled with the second end of the gas flow conduit, and a plate disposed around the gas flow conduit and in a spaced relationship from the nozzle structure, wherein both the one or more perforated conduits and the plate extend radially from an axis of the gas flow conduit.

11 Claims, 9 Drawing Sheets

FOREIGN PATENT DOCUMENTS

| | | | |
|---|---|---|---|
| EP | 1 932 942 | | 6/2008 |
| JP | 52-19462 | * | 2/1977 |
| JP | 06 240456 | | 8/1994 |
| JP | 2001 115263 | | 4/2001 |
| JP | 2001 131754 | | 5/2001 |
| JP | 2002 083777 | | 3/2002 |
| JP | 2003 516304 | | 5/2003 |
| JP | 2005 539371 | | 12/2005 |
| JP | 2007 239008 | | 9/2007 |
| WO | WO 01 42539 | | 6/2001 |
| WO | WO 03 047735 | | 6/2003 |
| WO | WO 2004 010473 | | 1/2004 |

* cited by examiner

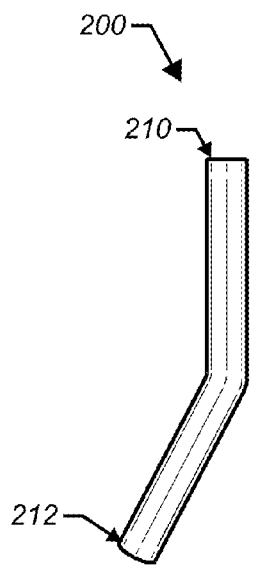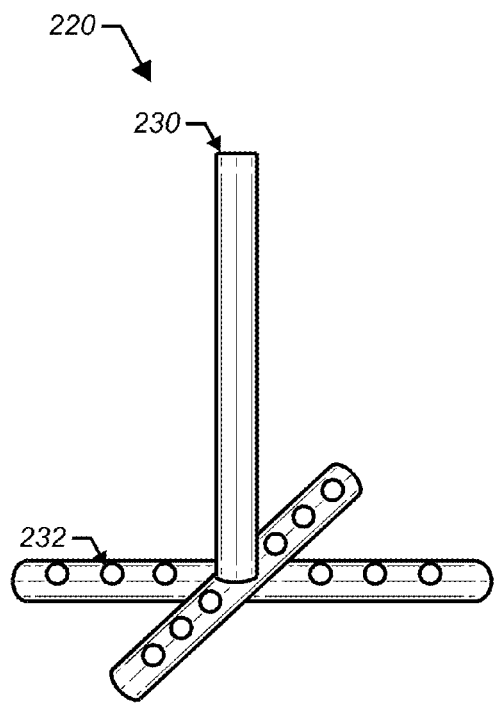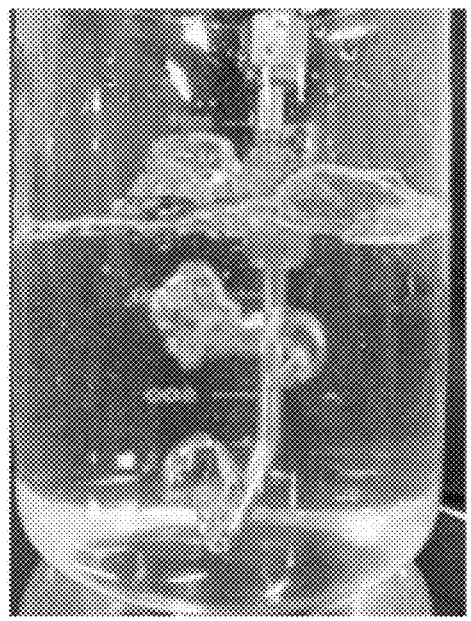
(PRIOR ART)
FIG. 2A
(PRIOR ART)
FIG. 2B
FIG. 6A
FIG. 6B

US 8,348,248 B2

BUBBLING SUPPLY SYSTEM FOR STABLE PRECURSOR SUPPLY

CROSS-REFERENCE TO RELATED APPLICATIONS

This application claims the benefit under 35 U.S.C. §119(e) to provisional application No. 61/159,334, filed Mar. 11, 2009, the entire contents of which are incorporated herein by reference.

BACKGROUND

1. Field of the Invention

Embodiments of the invention generally relate to apparatus and methods for vaporizing liquid precursors. In particular, the apparatus and methods for vaporizing liquid precursors are drawn to bubbler nozzle structure and method for using.

2. Description of the Related Art

New advancements in semiconductor processing require improved delivery of liquid precursors to a processing chamber for using in multiple processes including material deposition processes. The liquid precursors are preferably applied in a vapor form for efficient use of the precursors and for effective control of the formation of deposited materials on a substrate in the processing chamber.

There are five accepted technologies that supply a liquid precursor vapor to a processing chamber. One process supplies the liquid precursor to a processing chamber in a liquid form with the flow rate controlled by liquid mass flow controller (LMFC) and then the precursor is evaporated by a vaporizer at the point of use. A second process involves a liquid precursor being evaporated by heating and the resulting vapor is supplied to a chamber with the flow rate controlled by a mass flow controller (MFC). A third process involves supplying a vapor of a precursor by flowing a carrier gas over the surface of the precursor contained in a canister and carrying the resultant precursor vapor out of the canister and subsequently to the process tool. In this process the carrier gas flow is never submerged in the precursor liquid. A fourth process provides a vapor of a liquid precursor from a canister to a chamber by vacuum draw system. Finally, a bubbling method may be used to vaporize the liquid precursor and deliver the resulting vapor to a processing chamber.

The bubbling method introduces the carrier gas into the precursor liquid so that a number of carrier gas bubbles are introduced into the precursor liquid. The carrier gas bubbles rise to the surface of the precursor and become saturated more or less close to the equilibrium vapor pressure of the precursor at the temperature of the canister. It may be appreciated by one skilled in the art that the efficiency of the bubbling process is effected by the size and rate of bubbles introduced into the precursor liquid as well as the height of the precursor liquid above the point of entry of the bubbles.

Precursors that are easily decomposed by heating cannot be supplied by the first two methods mentioned above. The subsequent two methods cannot be used for supplying a large amount of precursor without heating and it has been difficult to effectively control the resulting flow rate of the heated liquid precursor vapor. The fifth process, termed the bubbling method does solve the difficulties in the first four processes; however, it has been observed that the bubbling method has difficulty maintaining a constant concentration and constant temperature during supply of the vaporized precursor.

Additionally, prior bubbling systems have been observed to have less than satisfactory bubbling results and less than satisfactory flow rates. For example, prior bubbling systems have difficulty providing a consistent and large amount of flow rate of precursor for use in the solar cell field manufacturing.

In one embodiment of a known bubbling system, a carrier gas is introduced into the liquid precursor through a dip-tube in the bubbler and removes evaporated vapor gas of the precursor from the bubbler. The mixture of carrier gas and precursor is supplied to a processing chamber, such as a chemical vapor deposition (CVD) chamber. In such as bubbling system, it is important to supply the precursor stably to the processing chamber at a high and efficient flow rate, and also to supply precursor without condensation at the supply piping line, and to ensure that all of the precursor that exits the canister in the carrier gas is fully vaporized and not in the form of droplets. The change of precursor concentration and condensation or existence of droplets of the precursor will affect the reproducibility and repeatability in a film forming process (CVD) including defects in the film uniformities of atomic component and/or thickness of the deposited films. Especially, condensation or the formation of droplets at the canister exit of the precursor in the supply piping has been observed to have a remarkable concentration change.

FIG. 1 shows the prior bubbling system 100 having a hot water bath to maintain constant liquid temperature. In FIG. 1, a bubbler nozzle 102 is connected to the end of a DIP tube 104 and generates bubbles 106 by flow of a gas into a volume of liquid precursor 108 in a container 120. Inert gas is introduced into the DIP tube using an inlet valve 110 (head valve), and vaporized precursor formed from the bubbles exits the container 120 via an outlet valve 112 (DIP valve). The prior bubbling system 102 uses prior bubbler nozzles 102, of which some embodiments 200, 220 are shown in FIGS. 2A and 2B having the respective gas inlets 210, 230, and the respective nozzle outlets 212, 232.

In the prior bubbling system 100, a water hot bath 130 is widely used to maintain the liquid precursor 132 at a constant temperature. The liquid precursor 108 in the container 120 (bubbler) loses heat through evaporation and the hot water bath 130 supplies the necessary heat to balance the heat that is lost by bubbling of the precursor liquid 108. The hot water bath 130 consists of a tank 134, a thermocouple 136, a sensor cable 138 of thermocouple 136, and a controller 140 that can control the liquid temperature by using a temperature signal from thermocouple 136. The hot water bath 130 is coupled to a water jacket heater surrounding the bubbler, or container 120 through lines 116 and 118, which lines are piping for circulating the hot water from the tank 134 to the water jacket heater 114.

The prior liquid control system has the following problems. It is difficult to maintain a constant liquid temperature because the hot water heated by water bath tank has to be circulated in the water jacket heater through piping line. It is difficult to heat the bottom of the bubbler and thus, heat the liquid in the bubbler efficiently. The system has a slow heat adjustment response time when dealing with a decrease of liquid temperature by evaporation of liquid precursor because there is a distance from heater bath tank and liquid precursor that has to be heated. This prior heating system requires extra costs and additional equipment including the water bath and hot water piping lines. Such a system requires additional maintenance to change the water in the water bath tank and cleaning the water bath tank. The water in the water bath tank is also a very dangerous liquid as the precursor reacts with water violently. Additionally, in the some cases, the heating system using water bath cannot be used at clean room in the semiconductor factory. Additionally, It is difficult to supply a precursor stably at the high flow rate without the use of a high flow rate of carrier gas and/or maintain high liquid temperature.

Further, there are three problems about bubbling supply as prior techniques. The first problem is the undesired time required to obtain constant concentration of liquid vapor at the beginning of supply. This problem causes an increase of waste of the precursor because the unstable concentration of precursor affects the property of the semiconductor device and the unstable concentration cannot be used for deposition purposes. A sudden decrease of liquid temperature due to evaporation heat also occurs when the bubbling supply is started, and if the heater cannot respond to the change, then the temperature must be increased to a higher than set value and overheat the heater.

The second problem is the fluctuating concentration of the precursor during bubbling. This problem causes the property of the product, such as semiconductor device or photovoltaic cell, to be less than desired as the unstable chemical vapor concentration affects thickness and uniformity of the substrate. The problem might also occur by the mist generation and/or undesired bubble size. Mist generation may be caused by pulsation (instability of surface of liquid precursor caused by waves or splashing) at the liquid precursor surface. The vapor concentration is easily fluctuated by generated mists as the mist precursor material is entrained in the exiting precursor flow and the mist forms irregularly and unpredictably.

There are two possible reasons for pulsation. The first reason is the bursting of bubbles having large sizes at the surface of the liquid precursor cause an increase in pulsation and an increase in flow of liquid precursor to the surface. The second reason is that the generated bubbles are not delocalized uniformly in the liquid sufficiently causing focused evaporation points in the liquid surface and partial bursting at surface of liquid. FIG. 6A shows the bubble generation from the tube edge. The bubbles generated from this nozzle are obviously large and the pulsation of the liquid surface has been observed to be heavy. FIG. 6B indicates the bubble generation from one common solution. The nozzle in FIG. 2B can reduce the size of bubbles well in comparison with the nozzle FIG. 2A. But the pulsation of the surface is not decreased because of the generating the bubble pathway made by rising bubbles (bursting bubbles at same points of the liquid surface).

The third problem occurs at low liquid levels. The concentration of the precursor rises/drops rapidly when the liquid level is close to empty in the bubbler. Therefore, the liquid in the bubbler cannot be effectively used. When the liquid level is closed to bubbler nozzle, the generated mists sometime increase the concentration, or the concentration decreased by lack of evaporation.

Therefore, there is a need for a process and apparatus for effectively bubbling a liquid precursor and delivering the precursor to a processing chamber.

SUMMARY

Embodiments of the invention generally provide apparatus and methods for vaporizing liquid precursors. In one embodiment, a bubbling system for supplying a vapor of liquid precursor is provided including a gas flow conduit having a first end and a second end, a nozzle structure connected to the second end of the gas flow conduit, and comprising one or more perforated conduits fluidly coupled with the second end of the gas flow conduit, and a plate disposed around the gas flow conduit and in a spaced relationship from the nozzle structure, wherein both the one or more perforated conduits and the plate extend radially from an axis of the gas flow conduit.

In another embodiment, a method for vaporizing a liquid precursor is provided including providing a bubbling system including a fluid container, a gas flow conduit having a first end and a second end disposed in a fluid container, a nozzle structure connected to the second end of the gas flow conduit, and comprising one or more perforated conduits fluidly coupled with the second end of the gas flow conduit, and a plate disposed around the gas flow conduit and in a spaced relationship from the nozzle structure, wherein both of the one or more perforated conduits and the plate extend radially from an axis of the gas flow conduit, and providing a liquid precursor to the fluid container with the liquid precursor and forming an initial volume greater than a height of the plate, providing a carrier gas through the gas conduit and exiting the one or more perforated conduits of the nozzle structure, wherein the exiting carrier gas forms first bubbles having a first size in the liquid precursor, the first bubbles contact the plate to form second bubbles having a second size less than the first size, and the second bubbles flow to a surface of the liquid precursor, and produce a vaporized precursor at the surface of the liquid precursor.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein:

FIGS. 2A-2B illustrates two embodiments of nozzles designs for use in the prior bubbling system of FIG. 1.

FIGS. 6A-6C illustrates bubble generation formations from the embodiment of nozzle structures of FIGS. 2A, 2B, and 5 respectively;

DESCRIPTION OF PREFERRED EMBODIMENTS

Disclosed herein are non-limiting embodiments of methods, apparatus and compounds which may be used in the manufacture of semiconductor, photovoltaic, LCD-TFT, or flat panel type devices. The problems identified in the background may be solved by various embodiments of this invention, including an innovative nozzle structure, a temperature control apparatus, a method to supply precursor at the beginning of supply, and a method for temperature control of supply line.

Embodiments of the invention provide a bubbling system for supplying a vapor of liquid precursor and a method for vaporizing a liquid precursor. Further embodiments of this invention relate to a bubbler nozzle structure coupled to a gas flow conduit and a heating system. A novel bubbling system is provided that can supply a vapor of precursor efficaciously from beginning of a supply to processing chamber with minimal or reduced precursor condensation. It is believed that the bubbler nozzle structure described herein will generate small bubbles with good bubble diffusion in the bubbler and can supply the liquid precursor stably to the semiconductor chamber without precursor condensation.

The bubbler nozzle technology has been observed to generate smaller bubbles than the prior art nozzle technology, which smaller bubbles have improved diffusion in the liquid precursor with reduced or minimal pulsation of the liquid surface. The bubbler nozzle technology has been observed to have minimal or reduced misting of the liquid precursor when the amount of the liquid precursor in the bubbler decreases. The bubbling method has been observed to supply a precursor with minimal or reduced temperature drop from the precursor evaporation at the start of the supply process as the sudden evaporation at the beginning of supply uses the system's energy and reduces the temperature of the liquid precursor. The liquid temperature control technology has been observed to provide high temperature measurement accuracy and can adjust the heat of the liquid precursor more rapidly than prior art systems. The invention design has also been observed to prevent re-liquefaction in the supply line during precursor supply.

Figure 1:
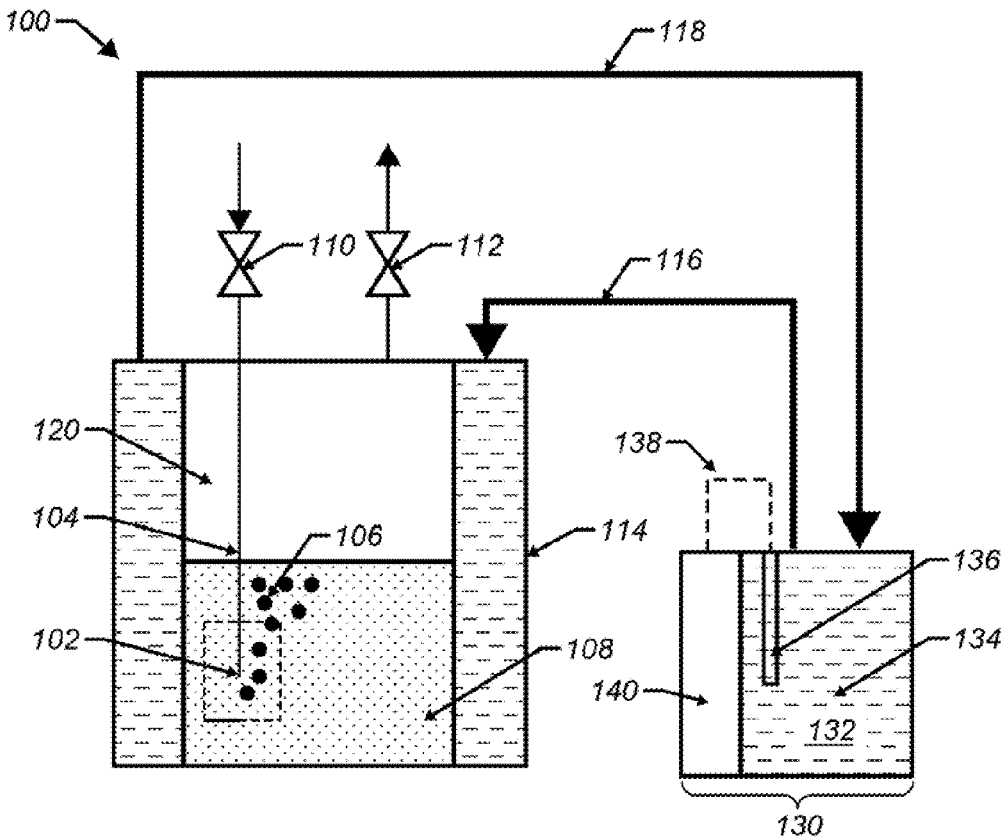
FIG. 1 illustrates a prior bubbling system having hot water bath to maintain liquid temperature constant temperature.
Figure 3:
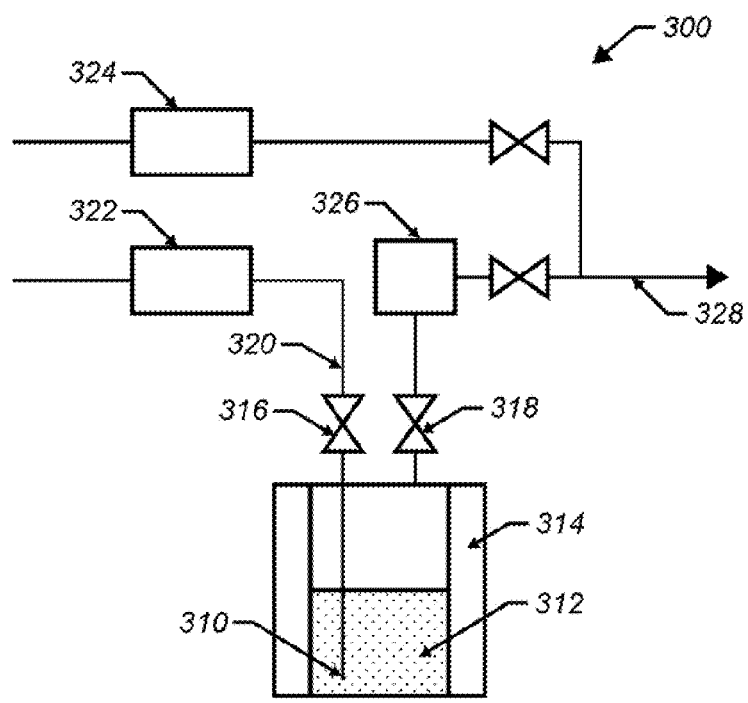
FIG. 3 illustrates one embodiment of a bubbling system for supplying the vapor of the liquid precursor according to the present invention.

FIG. 3 shows a bubbling system 300 according to one embodiment of the invention for supplying a liquid precursor vapor. A liquid precursor 312 disposed in the bubbling system 300 is supplied with a carrier gas having a flow rate controlled by a mass flow controller 322, which is introduced into the liquid precursor 312 through a DIP tube line 320 via a valve 316. The carrier gas flows through a nozzle structure 310 to generate bubbles that diffuse through the liquid to the surface of the liquid precursor 312 to evaporate and is then transferred to a chamber by a supply line 328 via a head valve 318. The liquid precursor vapor flow rate may be measured by monitor 326. In some cases, the carrier gas containing the liquid precursor may be further diluted with an additional inert gas, which flow rate may be controlled by a mass flow controller 324 before the reactor. Inert gases, including nitrogen, argon, helium, and combinations thereof, may be used as the carrier gas (or dilution gas). The precursor's gaseous concentration in carrier gas may be represented by ratio of partial pressure of the precursor in the bubbler. The liquid precursor may be an organometallic precursor selected from the group of diethyl zinc, dimethyl zinc, trimethyl aluminum, and combinations thereof In theory, the flow rate of the precursor may be controlled by the liquid temperature, which may be controlled by the heater such as a hot water bath 314, the flow rate of the carrier gas that may be adjusted by a mass flow controller 322, and the pressure controlled by a back-pressure controller (not shown) in the bubbler or a pump (not shown). However, it has been observed that the bubbler design, liquid temperature control, and supply piping line heating control are important to supply the vapor of liquid precursor stably from the beginning of the supply to the semiconductor reactor at the high efficiency without precursor condensation.

Figure 5:
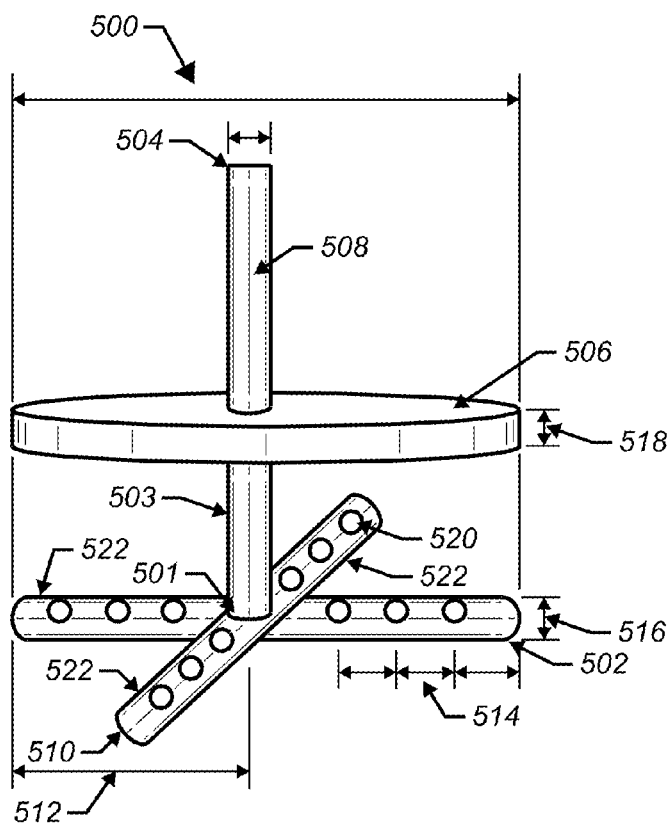
FIG. 5 illustrates one embodiment of a nozzle structure according to the present invention.

FIG. 5 disclose one embodiment of a nozzle structure 500 for a bubbler. The bubbler nozzle structure comprises a gas conduit 508, or tube, having a first end 504 coupled to a gas source (not shown), and a second end 503 coupled to a nozzle structure 501. A plate 506, such as in an annular disk shape, is disposed around the gas conduit 508. The gas conduit 508 may be of any necessary diameter depending on the gas flow rate and size of the bubbler. In one example, the gas conduit 508 is a cylindrical structure having a diameter between ⅛ inches and 1 inch, such as ¼ inch diameter.

The nozzle structure 501 may include one or more perforated conduits 502 fluidly coupled to the gas conduit 508 and may be disposed at any angle from the second end in relation to the gas conduit, 508, such as being orthogonally disposed in relation to the gas conduit 508 as shown in FIG. 5. Each of the one or more perforated conduits 502 may further include one or more arms 522. Each arm 522 may be in any shape including a cylindrical shaped, with a closed end 510. Each arm may have a length between 1 cm and 10 cm, such as from about 2 cm to about 6.4 cm, from an axis of the gas conduit 508. The cylindrical shape may have a diameter 516 between ⅛ inches and 1 inch, such as ¼ inch diameter. The cylindrical shape may also have a diameter 516 from about 0.5 cm to about 1.5 cm. In one embodiment, each arm has the same diameter as the gas conduit 508. In an embodiment having two or more perforated conduits 502, the conduits may be spaced from 15° to 90° from each other, for example, two conduits may be spaced 90° from each other.

Each of one or more arms 522 may include a plurality of perforations 520 for flow of a gas there though. The perforations are preferably disposed linearly along the arm 522 and may be in an equidistant spaced manner 514 from each other, such as a 5 mm distance disposed between the centers of each perforation 520. The perforations 520 may be in any shape, such as round, and have a width or diameter from about 0.1 mm to about 3 mm, such as about 0.2 mm in diameter.

The plate 506 is disposed around the gas conduit 508. A plate 506 may be in any shape, such as an annular disk shape or a polygonal shape. The plate, for example, may have a thickness 518 from about 0.1 mm to about 3 mm, such as about 1.5 mm. The plate may be made from stainless steel, such as stainless steel alloys SS316L EP, SS304, Inconel, Monel, Hastelloy, or combinations thereof. The alloy selection is made based upon an optimization of fabrication costs and chemical compatibility.

The plate is disposed in a substantially parallel spaced relationship from the nozzle structure 501. The invention contemplates that the plate 506 may be disposed at an angle that is not parallel to the nozzle structure 501. The plate 506 and the one or more perforated conduits of the nozzle structure 501 may both extend radially from an axis of the gas flow conduit.

The plate 506 is disposed from the nozzle structure 501 along the gas flow conduit 508 by a ratio of distance from the nozzle structure to an annular disk diameter from about 1:12 to about 1:1. For example, the plate may be disposed from about 0.5 cm to about 6 cm from the nozzle structure along the gas flow conduit 508 from a nozzle having a perforated conduit having a length of 6 cm. The relative position between the nozzle structure 501 and the plate 506 may be adjusted for control of the bubble evolution process. For example, the relative position may be adjusted as necessary to control the flow of a bubble of carrier gas through the nozzle structure 501, to be ejected from a perforation, and then contact the disk to form a smaller bubble and to reduce pulsation at the liquid surface.

The plate 506 has a width or diameter equal to or greater than any length of the one or more perforated conduits. For example, if the one or more conduits have a length of about 64 mm (length 512 of about 32 mm for 2 arms), the plate 506 would have a width or diameter of about 64 mm or greater. In one embodiment, plate 506 has a ratio of width or diameter (annular disk) to perforated conduit length from greater than 1:1 to about 2:1. In one embodiment, the plate 506 is an annular disk having a disk diameter from about 4 cm to about 8 cm and is disposed from about 3 cm to about 4 cm from the nozzle structure along the gas flow conduit.

Alternatively, the plate 506 may have grooves or a patterned lower surface to direct the flow of bubbles contacting the lower surface. The plate may also have an angle surface above or below an orthogonal plane, such as an upward taper. The plate 506 may also be coated with a material to enhance smaller bubble formation, enhance distribution of the bubbles, and combinations thereof.

It is believed that the bubbler nozzle as described herein can make well-diffused small bubbles. Bubbles generally have a size that corresponds to the size of the perforations 520, for example a 1 mm perforation will generally form 1 mm in diameter bubbles. Contact with the plate 506 allows for the surface tension of the bubble to rupture and reform, thereby creating bubbles having a size smaller than the original bubble size. Additionally, as the plate 506 interferes with the flow of the bubbles, the rising speed of the bubbles from the disk is less than the rising speed of the bubbles prior to contact. The combination of smaller bubble size, improved bubble diffusion, and reduced rising speed is believed to reduce liquid precursor surface pulsation and provide a more uniform vapor precursor evolution. Additionally, if and/or when the liquid level of the container becomes less than that of the plate 506 (no longer submerged), it has been observed that the plate reduces vaporization of the liquid precursor caused by splashing or misting by providing an anti-splash surface and surface on which liquid precursor may form. Moreover the plate 506 can prevent mist flow as a shield, and can help to evaporate liquid by horizontal flow on the liquid surface after the liquid level is reduced under the disk.

Figure 4:
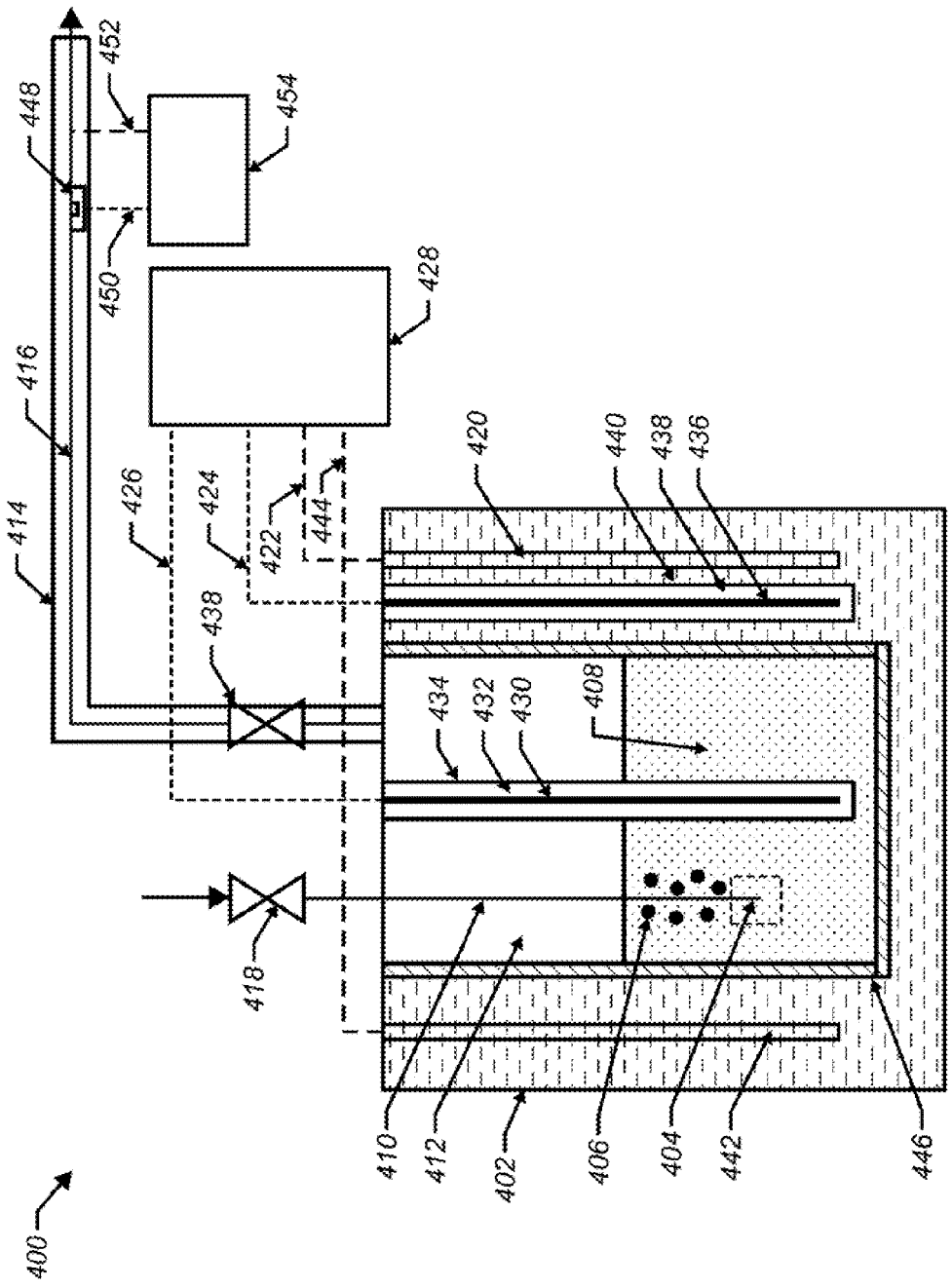
FIG. 4 illustrates one embodiment of a bubbling system for supplying the vapor of the liquid precursor according to the present invention.

FIG. 4 illustrates one embodiment of a bubbling supply unit of this invention. The bubbling supply unit 400 has a bubbler body, or container 412, having a gas conduit 410 disposed therein and coupled to a carrier gas inlet valve 418 and a precursor supply valve 458 formed in a top portion of the container 412. The container may have a volume from 0.1 Liters to 10 liters in size, for example from about 0.5 liters to about 5 liters in volume. As mentioned above, a bubbler nozzle 404 may be connected to an end of the gas conduit 410 to make bubbles 406 in the liquid precursor 408 is shown in FIG. 4. The liquid precursor may be maintained at a processing temperature from about 0° C. to about 200° C., for examples from about 20° C. to about 60° C. The canister may be provided with a pressure from about 50 Torr to about 760 Torr at a flow rate from about 100 sccm to 10 slm, for example about 1 slm to 5 slm. The liquid precursor may be disposed in the container at a volume between about 0.4 L and about 8 L depending on the size of the container and is preferable added in a volume sufficient to be higher than the plate 508, i.e., the plate 508 is submerged in the liquid precursor.

The container 412 also has a port 434, which may be made of stainless steel, for a thermocouple 430 disposed therein that can monitor a liquid precursor 408 temperature in the container 412. A heat diffusion gel 432 to improve heat conduction from liquid to thermocouple may be introduced into the space between the port 434 and the thermocouple 430.

A jacket heater 402, which may be made of aluminum, surrounds the sides and bottom of the container 412 and may comprise one or more heaters, such as heaters 420, 442, which heat can be conducted to the liquid precursor 408 in the container 412 efficiently. The jacket heater 402 also has a port 440 for a thermocouple 436, which may also have a heat diffusion gel 438 disposed into the space between the port 440 and the thermocouple 436. Optionally, a heat diffusion sheet 446 that can improve heat conduction from jacket heater to liquid precursor 408 may be disposed between the heater jacket 402 and the container 412. The jacket heater can heat the bubbler from the bottom. Therefore the structural feature of this heating system is that this heating system has a jacket heater made of aluminum that has a high conduction, innovative jacket heater structure that can heat the bubbler from both of bottom and side, the heat diffusion gel between the port and thermocouple and heat diffusion sheet between bubbler and the jacket heater.

One feature of liquid temperature control system is that the controller 428 can control a liquid's temperature by a cascade control process accurately by multiple thermocouples, such as thermocouples 430, 436. The first thermocouple 430 measures the temperature of the liquid precursor 408 and the second thermocouple 436 measures the temperature of the jacket heater 402, both of which are coupled to the controller by signal lines 424, 426. The controller also measure and controls the heater of the heating jacket via signal lines 422, 444. The cascade control can give heat quickly to the liquid before temperature of liquid monitored by thermocouple 430 decreases beyond acceptable levels. Because the temperature of the jacket heater is monitored by the thermocouple 436, the controller 428 can give heat to the liquid according to small temperature change of jacket heater by precursor evaporation.

A controller 454 is disposed adjacent the container 412 to maintain temperature of the supply piping line 416 constant, so vapor of the precursor can be supplied to the processing chamber with reduced or minimal condensation within the supply piping line 416. The controller consists of a line heater 414, a thermocouple 448 for monitoring temperature of the piping line, a sensor cable 450 for the thermocouple, and an electricity supply cable 452.

Figure 16:
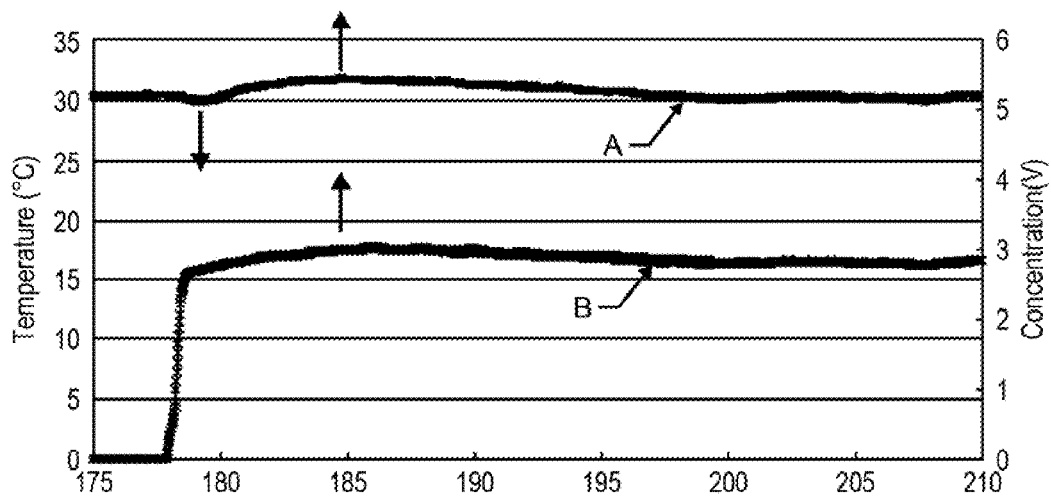
FIG. 16 is a chart illustrating the effect of evaporation on a liquid precursor temperature and on precursor concentration for a precursor bubbled from a prior art nozzle and bubbling system.

When supplying a vaporized precursor, initiation of the vaporization process can detrimentally affect precursor evolution uniformity as the evaporation process removes the heat in the liquid precursor, thereby detrimentally affecting precursor liquid temperature and thus evolution consistency. When liquid temperature decreases rapidly, the heater has to provide additional heat to the liquid precursor to maintain the controlled temperature. As a result, it is shown that the liquid temperature decreases under the controlled value, and then increases over controlled value. This concentration change is shown in FIG. 16 that indicates result of bubbling test. This temperature change and concentration change was not observed in the system as shown in FIG. 4 using the nozzle structure 501 described herein.

Figure 7:
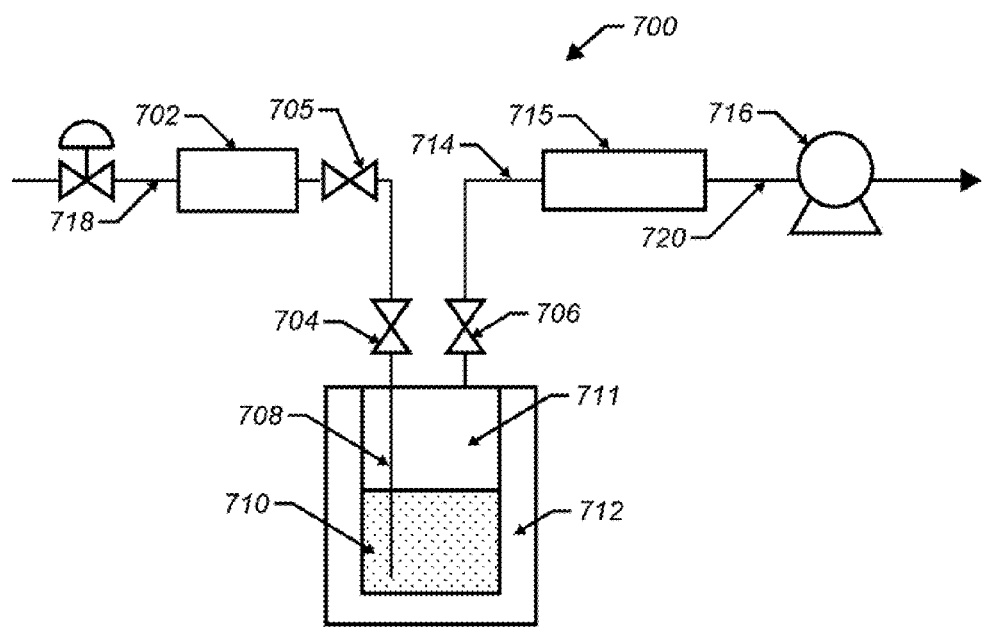
FIG. 7 illustrates one embodiment of an experimental bubbling system for supplying the vapor of the liquid precursor.

The data from FIG. 16 was obtained using the bubbling system 700 as described in FIG. 7. The liquid precursor 710 is octane at a controlled temperature of 30° C. controlled by the jacket heater 712, utilizing a carrier gas of argon at a flow rate of 3 slm (standard liters per minute) controlled by a mass flow controller (MFC) 702 and a bubbling pressure of 170 Torr controlled by the vacuum pump 716. The argon carrier gas is introduced into the liquid precursor 710 through a carrier gas line 718, a gas conduit line (DIP tube) 708 and a carrier gas valves 704, 705. In the container (bubbler) 711 the liquid is aerated with argon, and then, the mixture gas is supplied to the gas concentration monitor through a supply valve 706 and supply lines 714, 720. The vacuum pump 716 is used to supply the mixture gas to the gas concentration monitor 715.

EXAMPLES

Aspects of the invention including the bubbler nozzle structure of FIG. 5, the liquid temperature control system, and the procedure to supply and line heating system, were compared in the following experiments to check the bubble movement in the liquid, to the check stability of the vapor concentration when using the nozzle structure of FIG. 5, to check how much of a given amount of liquid in the bubbler can be used, and to check the effectiveness of the innovative procedure to supply the liquid precursor.

Experiment 1

Bubble Generation from Nozzles

Figure 6C:
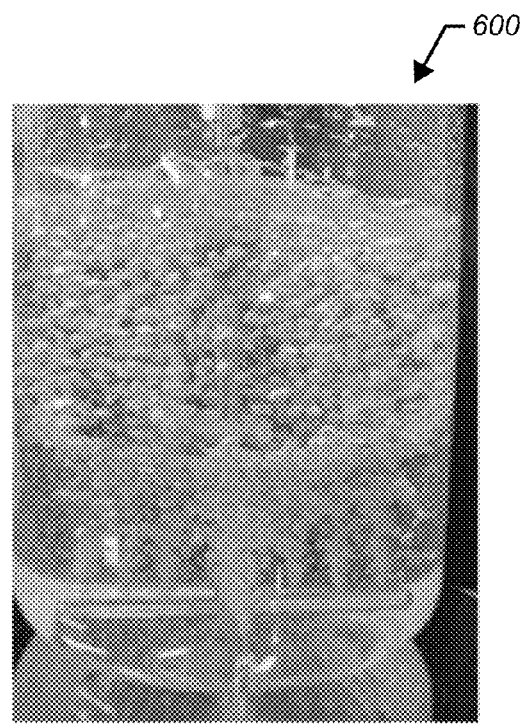

The bubbling system described herein with the nozzle structure as shown in FIG. 5 was compared to prior art nozzle structures as shown in FIGS. 2A and 2B with regard to bubble generation and the movement of bubbles and was observed during a bubbling supply process as shown in FIGS. 6A, 6B, and 6C. The bubbling process for all three nozzle structures includes flowing argon gas (Ar) at a flow rate of about 3 slm (standard liters per minute) through a liquid precursor of water with the container at atmospheric pressure.

The bubbles generated from the nozzle structure 600 of FIG. 5 as shown in FIG. 6C was observed to have improved diffusion, are more homogenously dispersed in the liquid precursor, and moreover, the bubble pulsated less and pulsated in a more uniform manner at the surface of the liquid than the bubbles generated by either nozzle structure in FIGS. 2A and 2B as shown in FIGS. 6A and 6B.

In FIG. 6C, the bubbles contact the disk just after being evolved (ejected) from the nozzle to form smaller bubbles, to reduce the rising rate, and the bubbles have a whirl flow generated at the circumference of the disk which allows for a more uniform diffusion above the disk to the liquid precursor surface. In contrast, the bubbles generated from the nozzle of FIG. 2A are not uniform in the liquid precursor and the bubble size at the liquid precursor surface are larger than bubbles generated at the surface of the liquid precursor of the FIG. 5 nozzle structure. Additionally, the bubbles generated from the nozzle of FIG. 2A are larger than the bubbles after ejected from the nozzle of FIG. 5. Moreover, the bubbles from the nozzle of FIG. 2A were observed to increase in size as the bubble rise to the surface of the liquid precursor. As such the pulsation on the surface of liquid was observed to be significant (pulsates heavily) compared to the pulsation as observed for the pulsation using the nozzle structure of FIG. 5.

Also in contrast to the nozzle structure of FIG. 5, the bubbles generated from the nozzle of FIG. 2B were observed to have an unimpeded rise toward the surface of the liquid and result in non-uniform diffusion of bubbles, concentration of bubbles and pulsation at the center of the liquid precursor surface and significant pulsation as compared to the pulsation as observed for FIG. 5.

Experiment 2

Concentration Stability During a Bubbling Supply Using the Present Nozzle

Experiments 2-4 were performed on the apparatus as shown in FIG. 7 described herein with the liquid control system as shown in FIG. 4 herein. In operation, argon gas with octane vapor is supplied to a gas concentration monitor 715 by introduction of an argon carrier into the bubbler 711 through a carrier gas line 718 via a carrier gas valve (DIP tube valve) 704. The argon gas is introduced from the respective nozzle structures as shown in FIG. 2A, 2B, and FIG. 5, respectively connected at the end of the DIP tube 708 disposed in the octane liquid precursor 710. The flow rate of the gas is controlled by a mass flow controller 702 and is maintained at a flow rate of 3 slm. The liquid precursor is maintained at a temperature of 30° C. by the jacket heater 712. At the gas phase above the liquid within the bubbler 711, the octane vapor is mixed with the argon gas, and then the entrained gas mixture is delivered to the gas concentration monitor 715 via a gas supply valve (head valve) 706 and through a supply line 720. The concentration of the liquid precursor, octane, is measured by the gas concentration monitor 715 as a voltage. A vacuum pump 716 is used to maintain a constant bubbling pressure (170 Torr) for the duration of the experiment. The supply line 714 before the gas concentration monitor 715 is heated at 40° C. The concentration stability of the liquid precursor vapor can be observed by monitoring the value of the gas concentration monitor 715, which provides a voltage signal based on an infrared absorption spectrometry (IR) measurement of the passing liquid precursor vapor, and the actual amount of liquid precursor vapor was measured by subtracting the weight of the remaining liquid precursor after bubbling from the weight of initial liquid precursor in the bubbler 711 over the time of the bubbling process.

Figure 8:
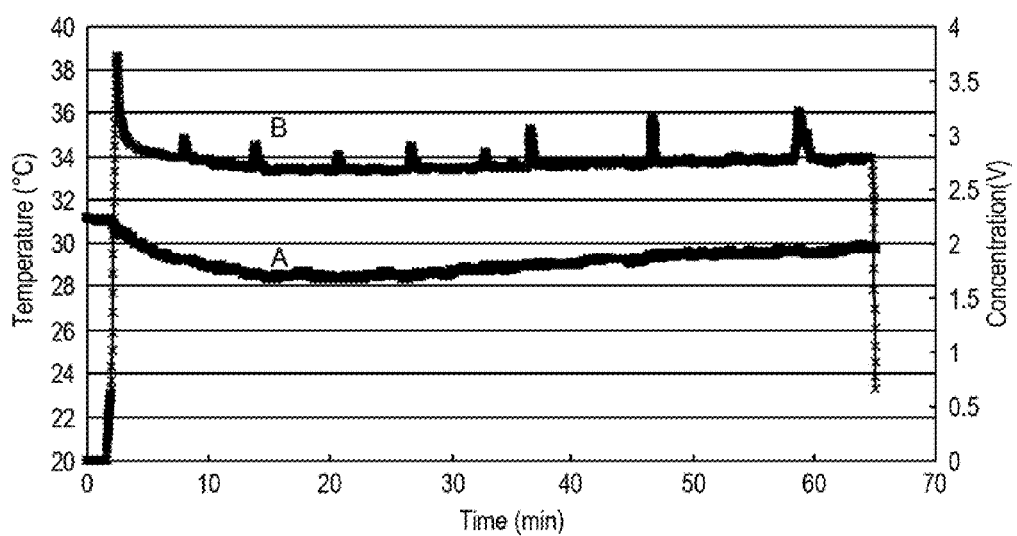
FIG. 8 is a chart illustrating precursor concentration and temperature over time for a precursor bubbled from one embodiment of a nozzle in FIG. 2A.
Figure 9:
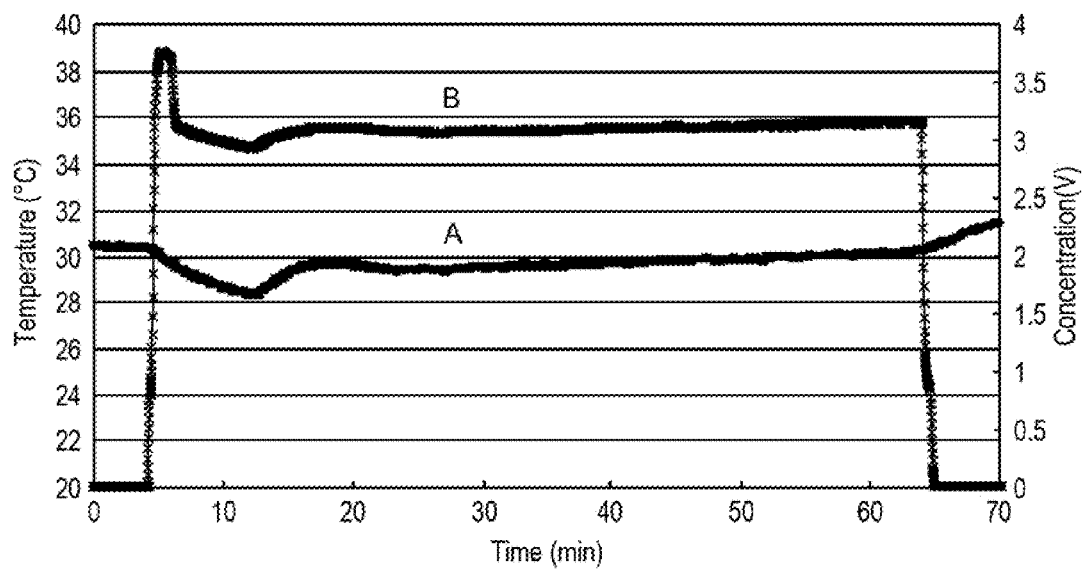
FIG. 9 is a chart illustrating precursor concentration and temperature over time for a precursor bubbled from one embodiment of another nozzle in FIG. 2B.
Figure 10:
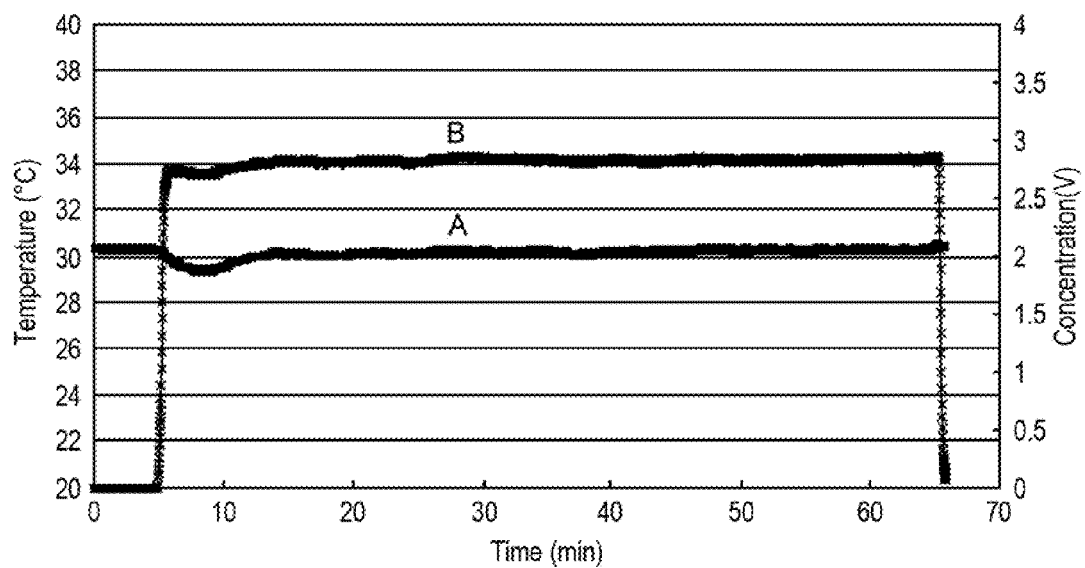
FIG. 10 is a chart illustrating precursor concentration and temperature over time for a precursor bubbled from one embodiment of another nozzle in FIG. 5.

Referring to FIGS. 8-10, the FIGS. 8-10 indicate the results of the bubbling tests respectively for nozzle structures of FIG. 2A, 2B, and FIG. 5. In FIG. 8, the nozzle structure of FIG. 2A was used to bubble an octane liquid precursor and the resulting temperature in Celsius degrees (line A) and the concentration of the octane precursor (line B), as measured in volts, was plotted over time. As FIG. 8 illustrates, the initial octane concentration increases sharply up to 3.7 V and then decreases over time to a base concentration of about 2.8 V. However, a series of fluctuations and spikes in the measured concentrations of up to about 3.3 V were observed over the next 60 minutes indicating a lack of precursor concentration stability. Additionally, the temperature of the precursor was observed to spike and the system was unable to provide a consistent temperature value at the targeting temperature value of 30° C. by the 50 minute mark.

In FIG. 9, the nozzle structure of FIG. 2B was used to bubble an octane liquid precursor and the resulting temperature in Celsius degrees (line A) and the concentration of the octane precursor (line B), as measured in volts, was plotted over time. As FIG. 9 illustrates, the initial octane concentration increases sharply up to 3.7 V and then decreases over time to a base concentration of about 3.0 V after 20 minutes, and provides a more or less consistent and slightly increasing concentration without concentration spikes for the next 40 minutes. Additionally, the temperature of the precursor was observed to spike and the system was unable to provide a consistent temperature value at the targeting temperature value of 30° C. by the 40 minute mark with a slight upward trend in temperature throughout the measure time period.

In FIG. 10, the nozzle structure of FIG. 5 was used to bubble an octane liquid precursor and the resulting temperature in Celsius degrees (line A) and the concentration of the octane precursor (line B), as measured in volts, was plotted over time. As FIG. 10 illustrates, the initial octane concentration did not have a sharp increase as observed for nozzle structures in FIGS. 2A and 2B. The precursor concentration reaches constant value of about 2.8 V in 10 min., which is kept at an almost constant concentration thereafter. The flow rate of the vapor was measured at about 2.46 g/min and this efficiency was 96% of the theoretical value of 2.56 g/min. Additionally, the temperature of the precursor was observed to have a minor temperature fluctuation at the beginning and the system was able to provide a consistent temperature value at the targeting temperature value of 30° C. after 10 minutes for the remainder of the observed experiment.

Additionally, processes performed using the apparatus of FIG. 7 and the nozzle structure of FIG. 5, were observed to provide a vaporized precursor at a dosage from about 1.5 grams/minute to about 11.8 grams per minute. A process performed at a temperature of 20° C., an argon flow rate of 3 slm, a bubble pressure of 100 Torr, using an octane liquid precursor was observed to have a vaporized precursor dosage of about 1.51 g/min. A process performed at a temperature of 30° C., an argon flow rate of 3 slm, a bubble pressure of 125 Torr, using an octane liquid precursor was observed to have a vaporized precursor dosage of about 2.46 g/min. A process performed at a temperature of 40° C., an argon flow rate of 3 slm, a bubble pressure of 147 Torr, using an octane liquid precursor was observed to have a vaporized precursor dosage of about 4.43 g/min. A process performed at a temperature of 50° C., an argon flow rate of 3 slm, a bubble pressure of 160 Torr, using an octane liquid precursor was observed to have a vaporized precursor dosage of about 6.84 g/min. A process performed at a temperature of 60° C., an argon flow rate of 3 slm, a bubble pressure of 177 Torr, using an octane liquid precursor was observed to have a vaporized precursor dosage of about 11.8 g/min.

Experiment 3

Check on How Much Liquid in the Bubbler Can Be Used

Figure 11:
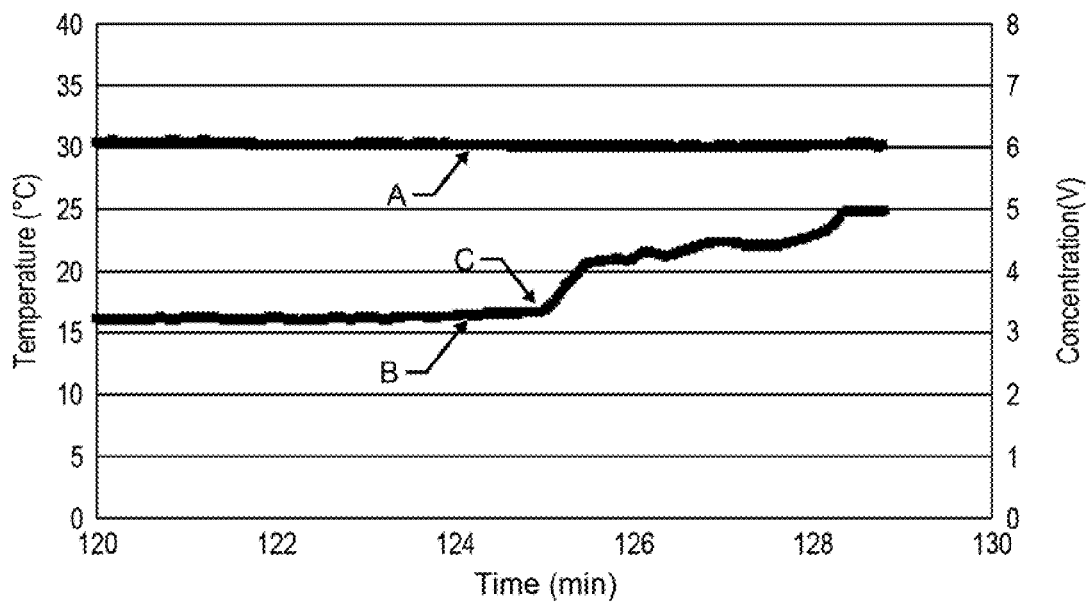
FIG. 11 is a chart illustrating precursor concentration and temperature over time for a precursor bubbled from a prior art nozzle structure of FIG. 2B.

Experiment 3 was conducted to compare how much of the liquid precursor in the bubbler may be used when utilizing the nozzle structure of FIG. 2B and the nozzle structure of FIG. 5 by the apparatus of FIG. 7 and the process described for Experiment 2. FIG. 11, which charts the data for the nozzle structure of FIG. 2B, illustrates liquid temperature (line A) and vapor concentration (line B) over time. In FIG. 11, for nozzle structure of FIG. 2B, the concentration of the precursor at a constant temperature increased dramatically and became unstable as the liquid surface level had reduced to about 2 cm distance from the nozzle structure at point C, and became more unstable with the further reduction in the liquid precursor surface level. In contrast, FIG. 12, which charts the data for the nozzle structure of FIG. 5, indicates only a slight increase at the point of C at a surprisingly and unexpected liquid surface level at about 0.5 cm distance from the nozzle structure. As such, it is observed that the installed plate 506 allows the carrier gas to stay longer with the liquid precursor for the evaporation and thereby, allows for an increase liquid precursor use efficiently in the bubbler than the prior nozzle structures of FIGS. 2A and 2B. This advantage is believed to become more pronounced as the bubbler diameter become larger.

It is thus observed that the bubbler nozzle structure of FIG. 5 provides improved stability of the vapor precursor concentration during supply as shown in Experiment 2. Additionally, it is observed that there is a reduced time length to achieve consistency and stability in temperature and concentration of less than about 10 min, and significantly reduced as compared to prior nozzles designs FIGS. 2A and 2B, which may require 15-20 min as shown in FIGS. 8-9. Such an improvement in precursor concentration and temperature stability can reduce waste of a liquid precursor because the vaporized liquid precursor will be unusable for processing until the vaporized liquid precursor concentration becomes stable.

Figure 12:
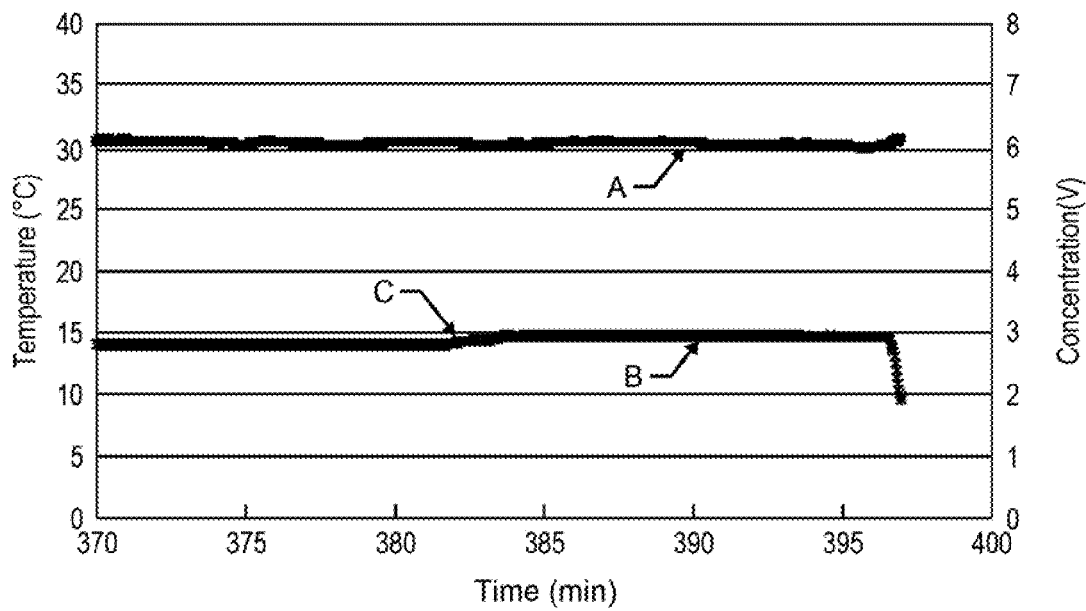
FIG. 12 is a chart illustrating precursor concentration and temperature over time for a precursor bubbled from the nozzle structure of FIG. 5.

It was surprising and unexpected discovered that the nozzle structure described herein provided for the rapid stabilization of the initial liquid precursor vapor concentration as shown in FIG. 10, and combined with the ability to continue stable delivery down to a liquid surface level of 0.5 cm as shown in FIG. 12, permits for substantially higher flow rates than is disclosed in the prior art for similar sized containers. As such, the bubbler system described herein has been observed to provide an effective dosage amount at higher flow rates, i.e., greater than 1 liter per minute as compared to prior art bubbling systems. Prior art bubbler system typically have liquid precursor vapor flow rates of 300-400 sccm, which the bubbling system described herein may have provide liquid precursor vapor flow rates from about 1 to about 10 slm (standard liters per minute).

The effective concentration delivery and temperature stability of the bubbling process using the nozzle structure design of FIG. 5 provides a key benefit that for a given size (internal volume) of a bubbler canister, a higher carrier gas flow rate can effectively be utilized. As a result, the nozzle structure design of FIG. 5 provides for a higher flow rate of the vaporized precursor than would be expected in a canister of the same size using conventional bubbling technology.

With such improvement in processing as provided by the invention described herein, the invention allows for the use smaller canisters than are required at a processing chamber and/or tool, thereby, providing for saving tool space and equipment costs. The improved processing from the nozzle structure of FIG. 5 also decreases the amount of material that will need to be stored in a user's facility with the improved efficiency of processing and allows the user to more readily handle the on-site materials limitations for some types of materials, such as the recommended 10 kgs safety limit for highly water reactive pyrophoric chemicals such as diethyl zinc described herein. Additionally, by increasing the effective carrier gas flow rate and precursor dosage rate, the invention effectively enables the customer to increase the number of deposition tools that are within a factory be saving space on the tool itself and the space savings and storage costs for the safety limits of storing the processing chemicals for the tools.

Further, since as shown in Experiment 3, the precursor can be used at low liquid level while maintaining the liquid precursor vapor concentration stability, thereby allowing a customer to use a large amount of precursor in the bubbler and have longer operation periods.

It has been further observed that the bubble generated from the nozzle structure of FIG. 5 can diffuse more uniformly in the bubbler which results in reduced or minimal pulsation at the surface of liquid precursor with improved concentration consistency.

Experiment 4

Concentration Stability During the Start of Bubbling Supply

Figure 13:
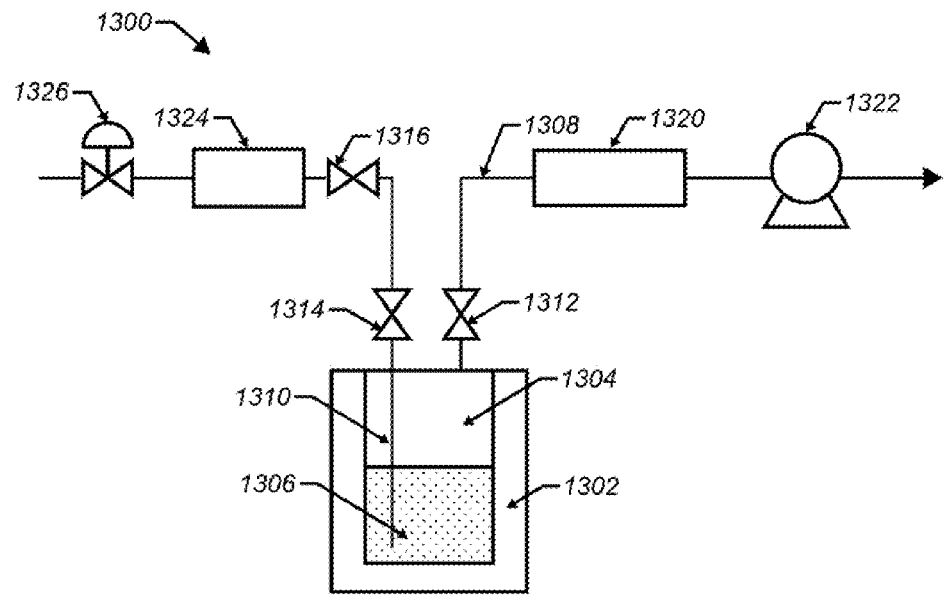
FIG. 13 illustrates one embodiment of a bubbling core unit.

A procedure to reduce the temperature decrease at the beginning of precursor supply is explained as follows and in reference to the bubbling core unit 1300 of FIG. 13. Initially, a regulator 1326 is adjusted to provide a minimum pressure to allow an argon gas flow rate of about 3 slm as monitored and controlled by a mass flow controller 1324. A make valve 1312 is opened to allow the vapor of a liquid precursor 1306 to exit the bubbler 1304 to a processing chamber through a supply line 1308 and a monitor 1320 by a vacuum as provided by a pump 1322, and then, a carrier gas valve 1314 is opened to allow carrier gas into the bubbler 1304 by a gas conduit 1310. A next valve 1316 is then opened slowly. In this experiment, the bubbler uses the nozzle structure of FIG. 5 and the supply line 1308 is kept at 40° C. The liquid precursor 1306 is octane and is maintained at about 30° C. by liquid temperature control system 1302 mentioned above. Bubbling pressure is maintained at about 170 Torr by pump 1322.

Figure 14:
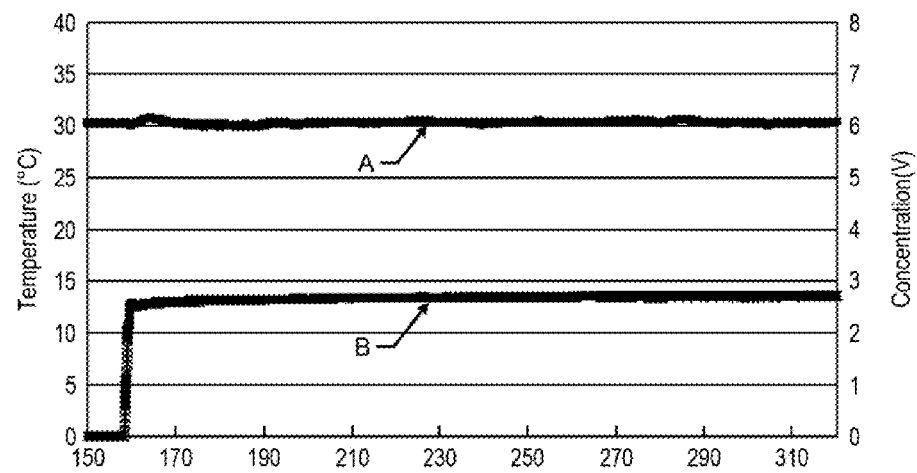
FIG. 14 is a chart illustrating precursor concentration and temperature over time for a precursor bubbled from a nozzle and bubbling system according to the invention.

As shown in FIG. 14, the vapor concentration quickly reaches a desired maximum concentration in less than ten minutes without a concentration decrease or increase at the beginning of supply. The vapor concentration and temperature of the liquid precursor are observed to be consistent and stable.

Additionally, bubbler systems may be stopped periodically for removing particles that may be formed due to moisture or oxygen in the carrier gas that reacts with the liquid precursor to decompose to generate the powder (solid). At such a stop for cleaning the bubbler, the dirty bubbler is removed and cleaned out at other location, and then, the bubbling system must be stopped for a long time.

Such an operation halting cleaning process and removal of equipment may be avoided by applying a solvent purge system is effective to remove the particles that can be supplied out with carrier gas. The solvent purge should be carried out after removing the liquid precursor, and the precursor re-filled after drying of the bubbler.

Figure 15:
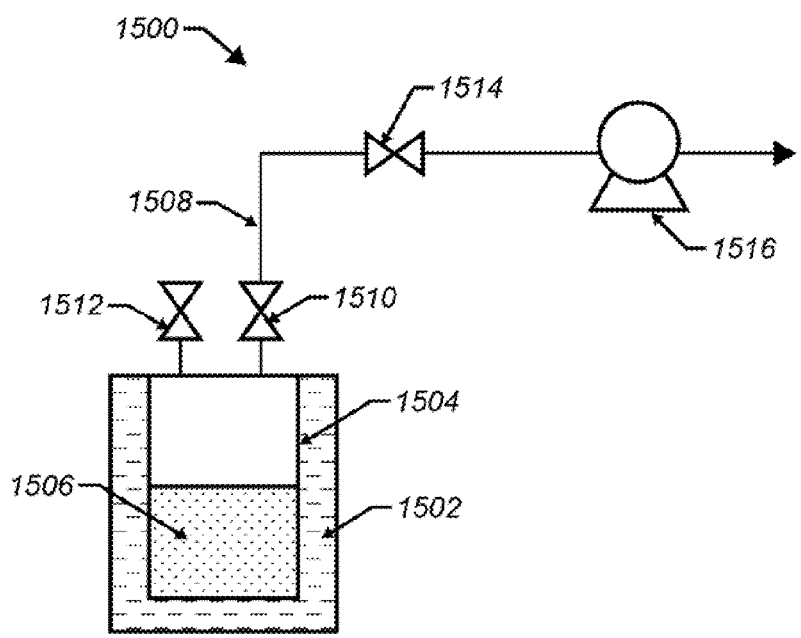
FIG. 15 illustrates one embodiment of an apparatus for drawing a liquid supply by a vacuum process.

FIG. 15 illustrates how a liquid supply can be controlled by a vacuum. In the apparatus 1500, a pump 1516 is coupled to the bubbler 1504 via line 1508 and valves 1510 and 1514. The pump exerts a vacuum on the bubbler 1504 and precursor 1506 in the bubbler 1504 under a controlled heating system 1502 is vaporized and drawn through valves 1510 and 1514 and line 1508, by the vacuum. A carrier gas may be introduced through valve 1512 to assist in the vaporization process from the vacuum.

Preferred processes and apparatus for practicing the present invention have been described. It will be understood and readily apparent to the skilled artisan that many changes and modifications may be made to the above-described embodiments without departing from the spirit and the scope of the present invention. The foregoing is illustrative only and that other embodiments of the integrated processes and apparatus may be employed without departing from the true scope of the invention defined in the following claims.

What is claimed is:

1. A bubbling system for supplying a vapor of liquid precursor, comprising:
   a gas flow conduit having a first end and a second end;
   a nozzle structure connected to the second end of the gas flow conduit, and comprising one or more perforated conduits fluidly coupled with the second end of the gas flow conduit, the one or more perforated conduits having a diameter from about 0.5 cm to about 1.5 cm and a length from about 1 cm to about 8 cm; and
   a plate disposed around the gas flow conduit and in a spaced relationship from the nozzle structure, the plate having a diameter from about 4 cm to about 8 cm and a thickness from about 0.1 mm to about 2 mm, wherein both the one or more perforated conduits and the plate extend radially from an axis of the gas flow conduit.

2. The bubbling system of claim 1, wherein the plate is disposed around the gas flow conduit and in a parallel spaced relationship from the nozzle structure.

3. The bubbling system of claim 2, wherein the plate comprises an annular disk having a diameter equal to or greater than any lengths of the one or more perforated conduits.

4. The bubbling system of claim 3, wherein the annular disk comprises a ratio of annular disk diameter to perforated conduit length from greater than 1:1 to about 2:1.

5. The bubbling system of claim 3, wherein the annular disk is disposed from the nozzle structure along the gas flow conduit by a ratio of distance from the nozzle structure to an annular disk diameter from about 1:12 to about 1:1.

6. The bubbling system of claim 1, wherein the plate is disposed from about 0.5 cm to about 6 cm from the nozzle structure along the gas flow conduit.

7. The bubbling system of claim 6, wherein the plate comprises an annular disk having a disk diameter from about 4 cm to about 8 cm and is disposed from about 3 cm to about 4 cm from the nozzle structure along the gas flow conduit with.

8. The bubbling system of claim 1, wherein the one or more perforated conduits are oriented in an orthogonal manner to the gas flow conduit wherein each of the one or more perforated conduits comprise two arms, and each arm comprises one or more perforations.

9. The bubbling system of claim 1, wherein the bubbling system further comprises the gas flow conduit disposed in a fluid container having a volume from about 0.1 liter to about 10 liters.

10. The bubbling system of claim 8, wherein each perforation is from about 0.1 mm to about 3 mm in diameter.

11. The bubbling system of claim 1, wherein the bubbler further comprises a jacket heater disposed on the sidewalls and bottom of the container and a controller coupled to the jacket heater.

* * * * *